(12) United States Patent
Oshiki

(10) Patent No.: US 10,535,677 B2
(45) Date of Patent: Jan. 14, 2020

(54) SEMICONDUCTOR MEMORY DEVICE AND MANUFACTURING METHOD THEREOF

(71) Applicant: TOSHIBA MEMORY CORPORATION, Minato-ku (JP)

(72) Inventor: Yusuke Oshiki, Kuwana (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 16/104,209

(22) Filed: Aug. 17, 2018

(65) Prior Publication Data
US 2019/0287987 A1    Sep. 19, 2019

(30) Foreign Application Priority Data

Mar. 19, 2018    (JP) .................. 2018-051527

(51) Int. Cl.
| | | |
|---|---|---|
| *H01L 23/522* | (2006.01) | |
| *H01L 21/768* | (2006.01) | |
| *H01L 23/532* | (2006.01) | |
| *H01L 27/11524* | (2017.01) | |
| *H01L 27/11536* | (2017.01) | |
| *H01L 27/11556* | (2017.01) | |
| *H01L 27/11582* | (2017.01) | |
| *H01L 27/11565* | (2017.01) | |
| *H01L 21/3213* | (2006.01) | |

(Continued)

(52) U.S. Cl.
CPC ... *H01L 27/11582* (2013.01); *H01L 21/31111* (2013.01); *H01L 21/32134* (2013.01); *H01L 21/76805* (2013.01); *H01L 21/76831* (2013.01); *H01L 27/11565* (2013.01); *H01L 29/40117* (2019.08)

(58) Field of Classification Search
CPC ......... H01L 21/31111; H01L 21/32134; H01L 21/76805; H01L 21/76838; H01L 21/76877; H01L 21/76885; H01L 21/76886; H01L 21/76895; H01L 27/11556; H01L 27/11582
See application file for complete search history.

(56) References Cited

U.S. PATENT DOCUMENTS 9,455,263 B2    9/2016    Zhang et al.
9,520,407 B2    12/2016   Fukuzumi et al.
(Continued)

FOREIGN PATENT DOCUMENTS

JP    2015-149413    8/2015

*Primary Examiner* — David C Spalla
(74) *Attorney, Agent, or Firm* — Oblon, McClelland, Maier & Neustadt, L.L.P.

(57) ABSTRACT

A semiconductor memory device according to an embodiment includes: a semiconductor substrate; an insulating film provided on the semiconductor substrate; a conductive layer group including at least two conductive layers; a stacked body provided on the conductive layer group and including a plurality of films stacked; a memory film provided in a hole, the hole penetrating the stacked body and a part of the conductive layer group; and a slit splitting the stacked body and terminating at a position deeper than a contact portion between the conductive layer group and the memory film. The conductive layer group has a band-shaped part projecting to the stacked body side at a portion of the hole, and a groove part recessed to the semiconductor substrate side at a portion under the slit.

10 Claims, 11 Drawing Sheets

(51) Int. Cl.
   *H01L 21/311*   (2006.01)
   *H01L 21/28*    (2006.01)

(56) References Cited

U.S. PATENT DOCUMENTS

| | | | |
|---|---|---|---|
| 9,876,031 B1* | 1/2018 | Shimizu | H01L 27/11582 |
| 9,985,098 B2* | 5/2018 | Matsumoto | H01L 27/11565 |
| 10,224,340 B2* | 3/2019 | Hada | H01L 27/11565 |
| 2015/0255481 A1* | 9/2015 | Baenninger | H01L 27/11582 |
| | | | 438/268 |
| 2016/0181264 A1* | 6/2016 | Miyamoto | H01L 27/11524 |
| | | | 257/314 |
| 2018/0374868 A1* | 12/2018 | Choi | H01L 27/11582 |
| 2019/0051599 A1* | 2/2019 | Zhang | H01L 23/5226 |

* cited by examiner

SEMICONDUCTOR MEMORY DEVICE AND MANUFACTURING METHOD THEREOF

CROSS-REFERENCE TO RELATED APPLICATIONS

This application is based upon and claims the benefit of priority from Japanese Patent Application No. 2018-051527, filed on Mar. 19, 2018; the entire contents of which are incorporated herein by reference.

FIELD

Embodiments of the present invention relate to a semiconductor memory device and a manufacturing method thereof.

BACKGROUND

For a semiconductor memory device, a structure in which memory cells are three-dimensionally arranged has been proposed recently. In this structure, a hole penetrating a stacked body including a plurality of electrode films stacked and a slit splitting the stacked body are formed.

In the hole, a memory film is formed. Further, a sacrificial film is formed at an upper part of a source line located below the stack. The sacrificial film is removed to expose a part of the memory film, a part of the exposed memory film is removed, and a conductive layer is formed at a removal part of the sacrificial film. This electrically connects a channel layer in a memory hole to the source line.

Since the hole needs to penetrate the sacrificial film (conductive layer), a thin sacrificial film is desirable in consideration of processing variation. Contrarily, since the slit needs to terminate in the sacrificial film (conductive layer), a thick sacrificial film is desirable in consideration of processing variation.

However, since the thickness of the sacrificial film has been conventionally uniform, it is difficult to absorb the processing variations of both the hole and the slit. In the case where a necessary depth is not ensured regarding the processing of the hole and the slit, the reliability as the semiconductor memory device may become insufficient.

Embodiments of the present invention provide a semiconductor memory device capable of improving the reliability and a manufacturing method thereof.

DETAILED DESCRIPTION

Embodiments will now be explained with reference to the accompanying drawings. The present invention is not limited to the embodiments.

(First Embodiment)

Figure 1:
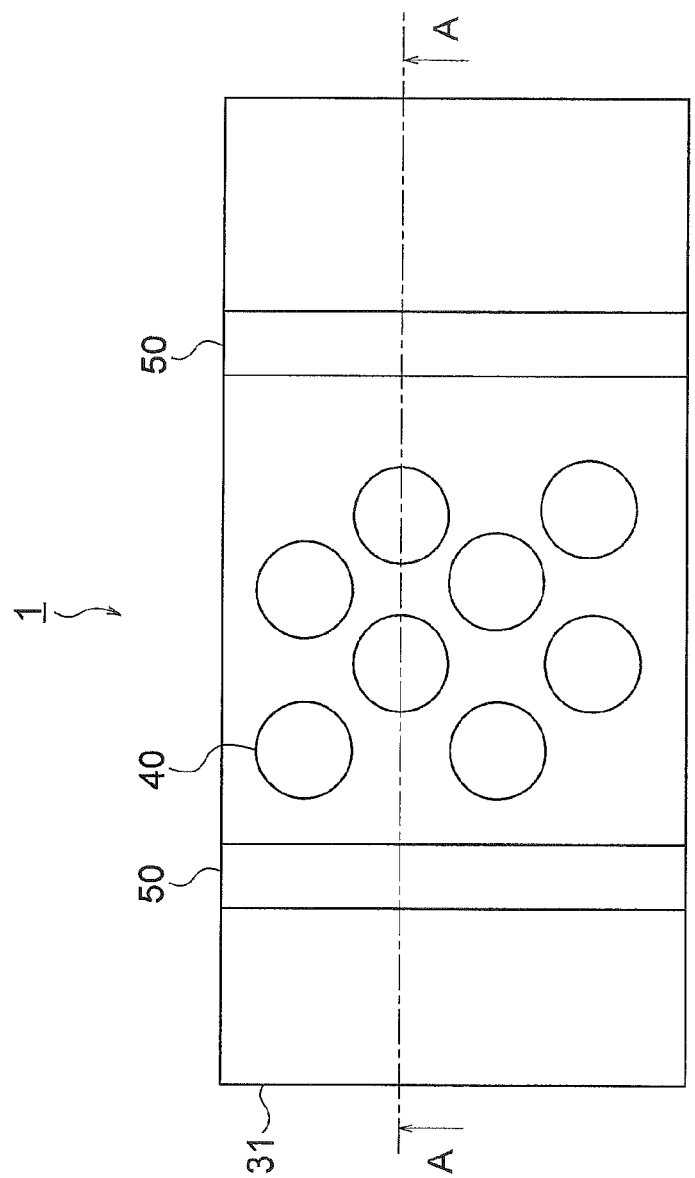
FIG. 1 is a plan view of a semiconductor memory device according to a first embodiment.
Figure 2:
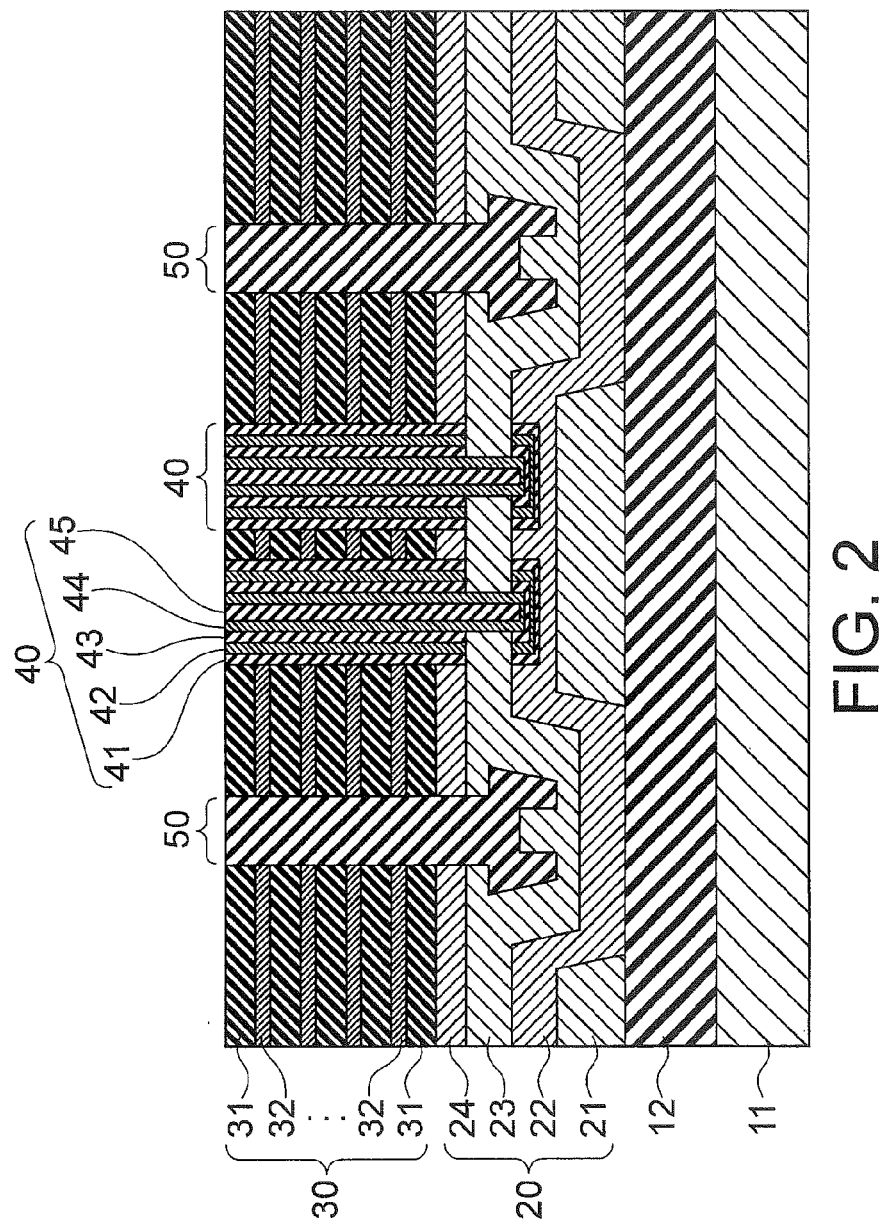
FIG. 2 is a cross-sectional view taken along a cutting line A-A illustrated in FIG. 1.

FIG. 1 is a plan view of a semiconductor memory device according to a first embodiment. FIG. 2 is a cross-sectional view taken along a cutting line A-A illustrated in FIG. 1. As illustrated in FIG. 1 and FIG. 2, a semiconductor memory device 1 according to this embodiment includes a semiconductor substrate 11, an insulating film 12, a conductive layer group 20, a stacked body 30, a memory film 40, and a slit 50.

The semiconductor substrate 11 is, for example, a silicon substrate. On the semiconductor substrate 11, the insulating film 12 is provided. The insulating film 12 is formed, for example, as a silicon oxide film ($SiO_2$). On the insulating film 12, the conductive layer group 20 is provided.

The conductive layer group 20 has a conductive layer 21 to a conductive layer 24. The conductive layer 21 (first conductive layer) functions as a source line arranged on the insulating film 12. The conductive layer 21 is formed, for example, as a metal film containing tungsten (W). The conductive layer 22 (second conductive layer) is provided on the conductive layer 21 and functions as a part of the source line. The conductive layer 22 is formed, for example, as a polysilicon film.

The conductive layer 23 (third conductive layer) is provided at a removal part of a later-explained sacrificial film, namely, between the conductive layer 22 and the conductive layer 24. The conductive layer 23 is in contact with a part of the memory film 40. The conductive layer 23 is formed, for example, as a polysilicon film obtained by epitaxially growing silicon contained in the conductive layer 22 and the conductive layer 24. The conductive layer 24 (forth conductive layer) is provided on the conductive layer 23. The conductive layer 24 is formed, for example, as a polysilicon film.

In the stacked body 30, an insulating film 31 and an electrode film 32 are alternately stacked. The insulating film 31 is formed, for example, as a silicon oxide film. The electrode film 32 is formed, for example, as a metal film containing tungsten and functions as a word line.

The memory film 40 includes a charge block layer 41, a charge storage layer 42, a tunnel insulating layer 43, a channel layer 44, and an insulating layer 45. The charge block layer 41, the tunnel insulating layer 43, and the insulating layer 45 are formed, for example, as silicon oxide layers. The charge storage layer 42 is formed, for example, as a silicon nitride (SiN) layer. The channel layer 44 is formed, for example, as a polysilicon layer. A side surface of the channel layer 44 is in contact with the conductive layer 23. Thus, the channel layer 44 is electrically connected to the conductive layer 22 being the source line.

The slit 50 splits the stacked body 30 and terminates in the conductive layer 23. A terminal end part (bottom part) of the slit 50 is located at a position deeper than a contact portion between the channel layer 44 and the conductive layer 23. In this embodiment, the slit 50 is filled with, for example, an insulating material such as a silicon oxide or the like.

A manufacturing method of the semiconductor memory device 1 according to this embodiment will be explained below with reference to FIG. 3 to FIG. 14.

Figure 3:
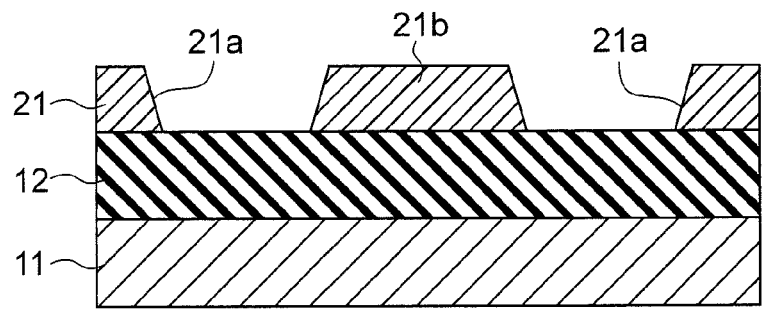
FIG. 3 is a cross-sectional view illustrating the formation of a groove part and a band-shaped part.

First of all, the insulating film 12 is formed on the semiconductor substrate 11, and the conductive layer 21 is then formed on the insulating film 12. Subsequently, as illustrated in FIG. 3, a groove part 21a and a band-shaped part 21b are formed in the conductive layer 21. In this embodiment, a mask pattern in a line shape is formed on the conductive layer 21 using the lithography technology. By removing the conductive layer 21 by RIE (Reactive Ion Etching) using the mask pattern, a groove is formed in the conductive layer 21. This groove corresponds to the groove part 21a. Besides, a portion left after the etching corresponds to the band-shaped part 21b. The mask pattern is removed after the etching of the conductive layer 21.

Figure 4:
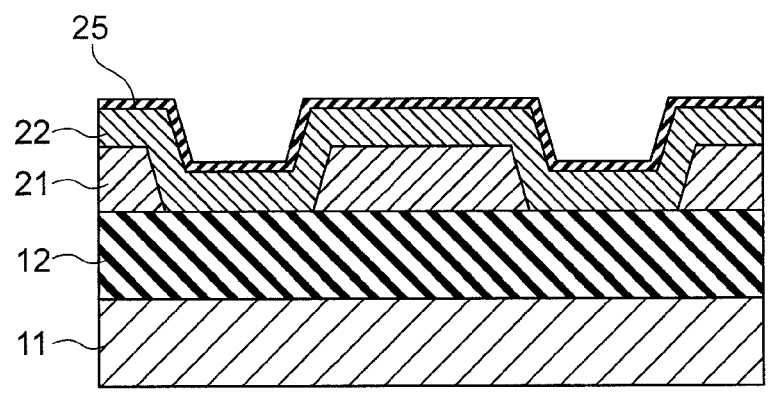
FIG. 4 is a cross-sectional view illustrating the formation of a conductive layer and an insulating film.

Next, as illustrated in FIG. 4, the conductive layer 22 is formed on the conductive layer 21, and an insulating film 25 is subsequently formed on the conductive layer 22. The insulating film 25 is formed, for example, as a silicon oxide film. The conductive layer 22 and the insulating film 25 are formed along a projecting and recessed shape of the conductive layer 21.

Figure 5:
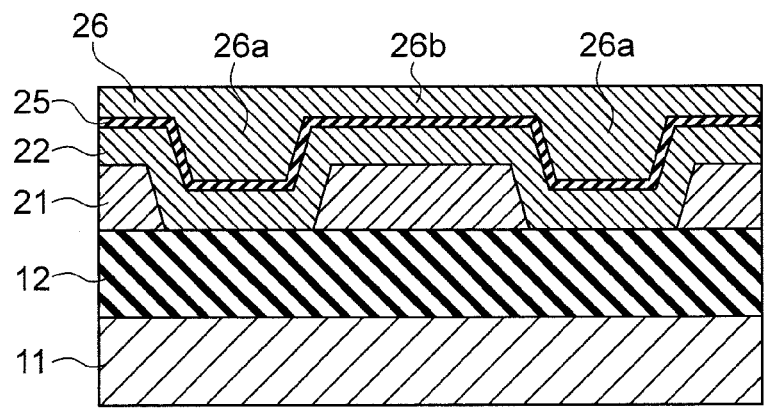
FIG. 5 is a cross-sectional view illustrating the formation of a sacrificial film.

Next, as illustrated in FIG. 5, a sacrificial film 26 is formed on the insulating film 25. The sacrificial film 26 is formed thicker than a depth of the groove part 21a and is planarized by CMP (Chemical Mechanical Polishing). As a result, the sacrificial film 26 has a thick film portion 26a and a thin film portion 26b due to the projecting and recessed shape of the conductive layer 21. The thick film portion 26a is provided on the groove part 21a of the conductive layer 21. On the other hand, the thin film portion 26b is provided on the band-shaped part 21b. It is desirable that the material of the sacrificial film 26 can ensure the selection ratio with respect to members to be processed in processing later-explained stacked body and spacer. In this embodiment, non-doped polysilicon is used as the material of the sacrificial film 26.

Figure 6:
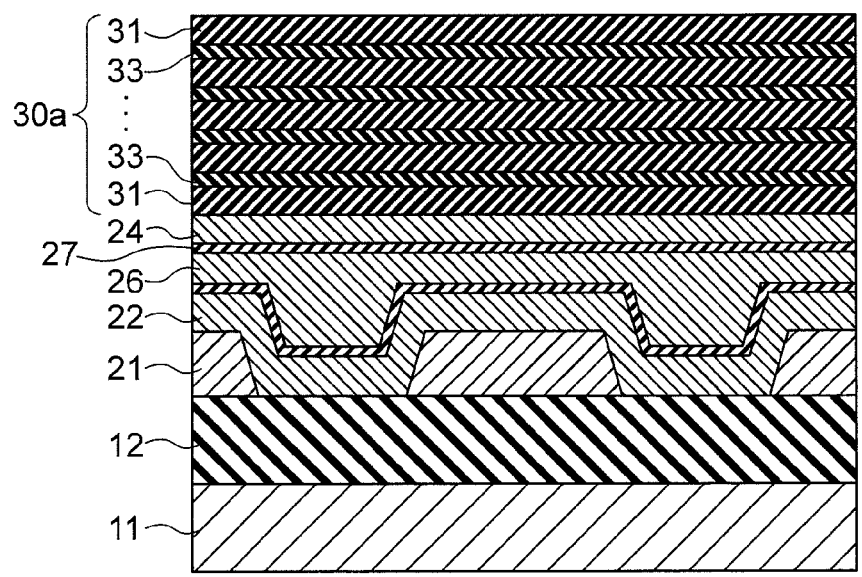
FIG. 6 is a cross-sectional view illustrating the formation of a stacked body.

Next, as illustrated in FIG. 6, an insulating film 27 is formed on the sacrificial film 26, and the conductive layer 24 is subsequently formed on the insulating film 27. The insulating film 27 is formed, for example, as a silicon oxide film. Further, a stacked body 30a is formed on the conductive layer 24. In the stacked body 30a, an insulating film 31 and an insulating film 33 are alternately stacked. The insulating film 33 is a sacrificial film for forming the electrode film 32 and contains, for example, a silicon nitride.

Figure 7:
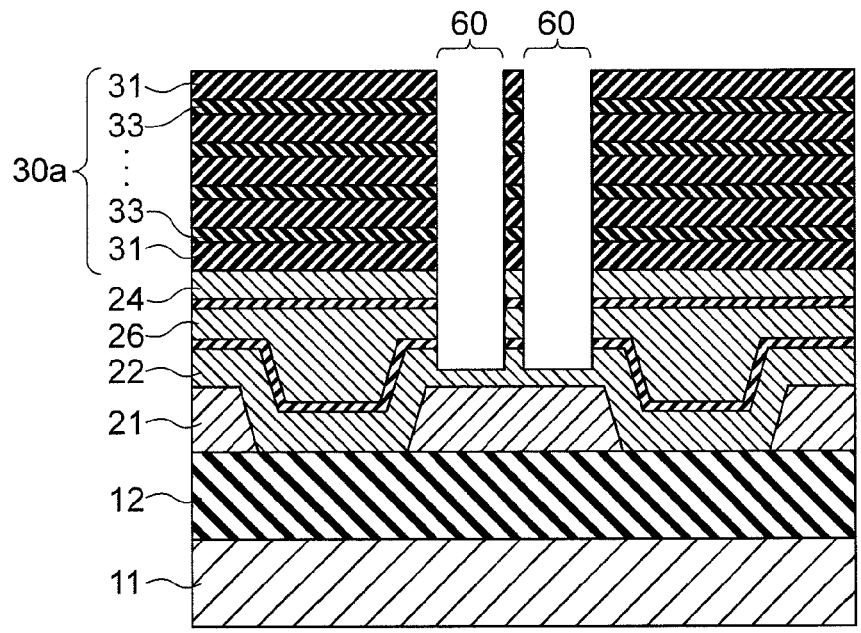
FIG. 7 is a cross-sectional view illustrating the formation of a hole.

Next, as illustrated in FIG. 7, a hole 60 is formed. The hole 60 is positioned by the mask pattern arranged on the thin film portion 26b of the sacrificial film 26, for example, using the lithography technology.

The hole 60 penetrates the stacked body 30a and the sacrificial film 26 and terminates at the midway of the conductive layer 22. In this embodiment, the hole 60 is formed at the thin film portion 26b of the sacrificial film 26. Therefore, even if the sacrificial film 26 and the conductive layer 22 are formed of the same material, the etching can be stopped in the conductive layer 22 by combining the etching processing with a low selection ratio and the etching processing with a high selection ratio with respect to the material.

Figure 8:
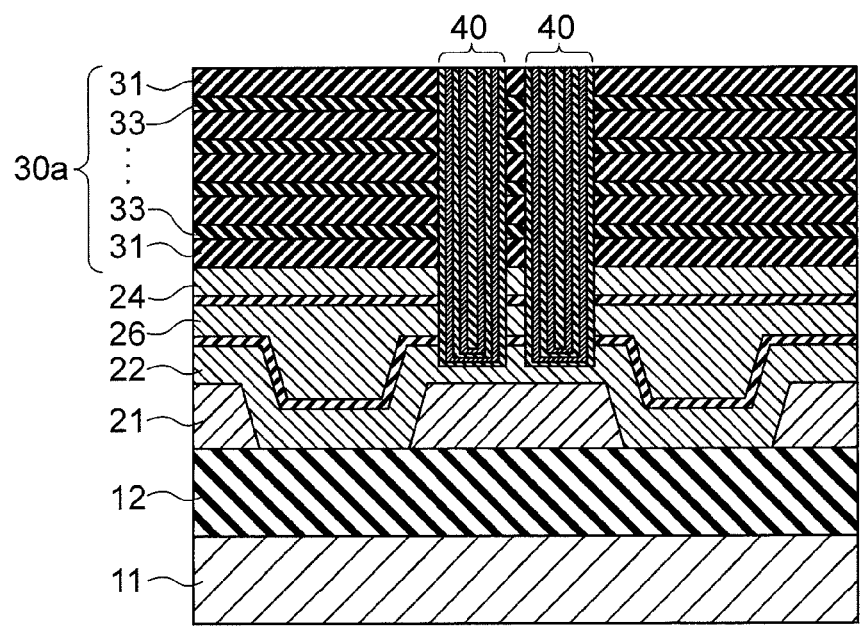
FIG. 8 is a cross-sectional view illustrating the formation of a memory film.

After the formation of the hole 60, a memory film 40 is formed in the hole 60 as illustrated in FIG. 8. At this process, the charge block layer 41, the charge storage layer 42, the tunnel insulating layer 43, and the channel layer 44 are stacked in sequence in the hole 60, and the insulating layer 45 is finally embedded.

Figure 9:
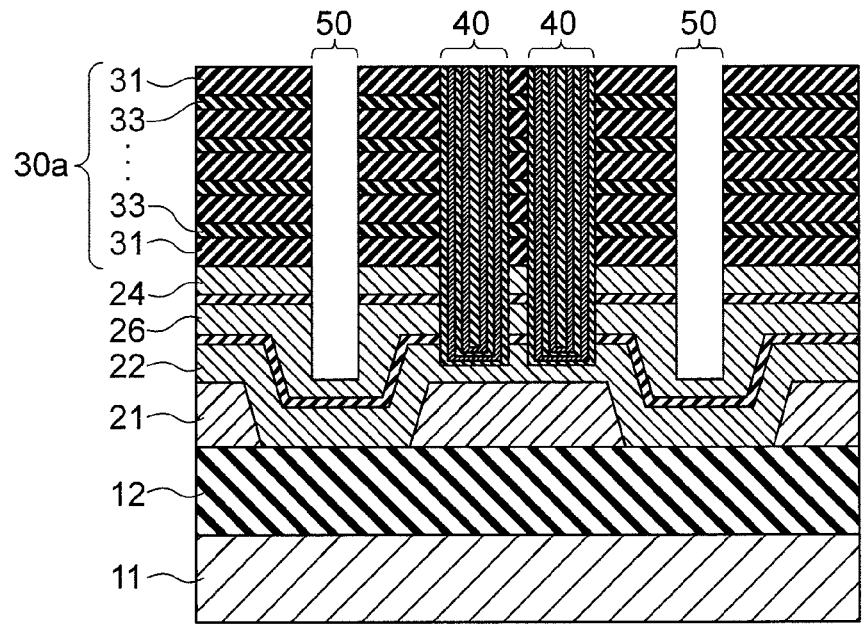
FIG. 9 is a cross-sectional view illustrating the formation of a slit.

Next, as illustrated in FIG. 9, a slit 50 is formed. The slit 50 is positioned by arranging the mask pattern on the thick film portion 26a of the sacrificial film 26, for example, using the lithography technology.

The slit 50 penetrates the stacked body 30a and terminates at the midway of the sacrificial film 26. In this embodiment, the slit 50 is formed at the thick film portion 26a of the sacrificial film 26. Therefore, by performing the etching processing with a high selection ratio with respect to the sacrificial film 26, processing variation can be absorbed while taking sufficient processing time.

Figure 10:
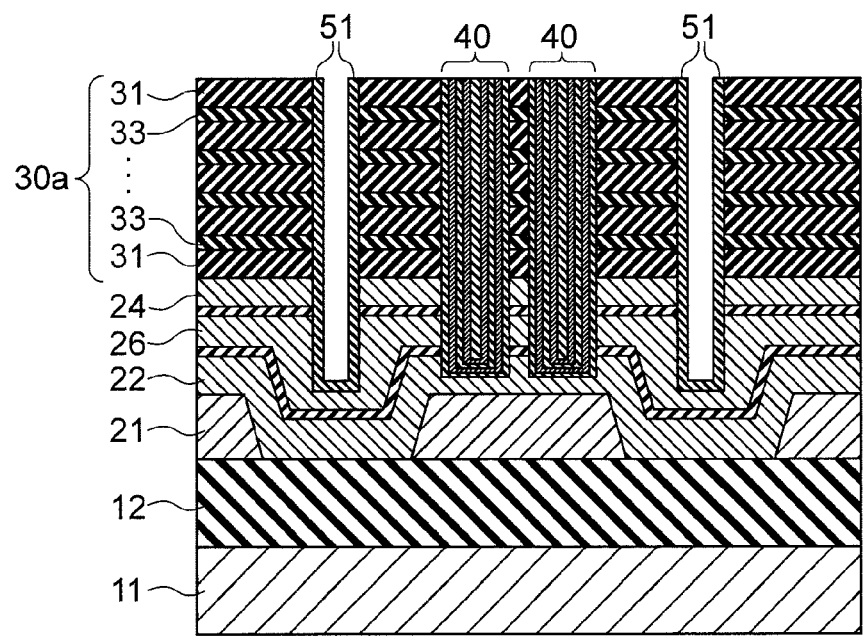
FIG. 10 is a cross-sectional view illustrating the formation of a spacer.
Figure 11:
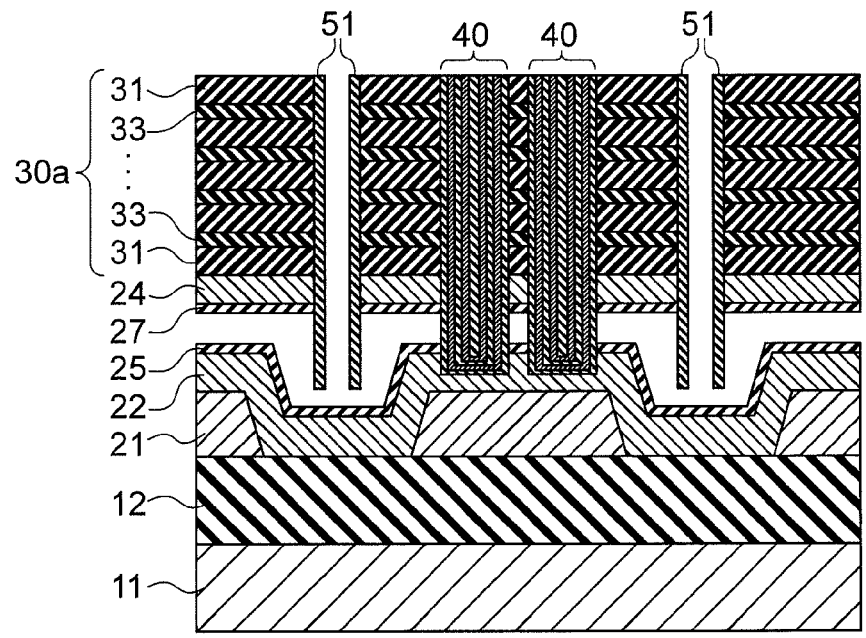
FIG. 11 is a cross-sectional view illustrating etching of the sacrificial film.

Next, as illustrated in FIG. 10, a spacer 51 is formed in the slit 50. The spacer 51 is formed, for example, a silicon nitride film. Subsequently, the spacer 51 formed at the bottom part of the slit 50 and the sacrificial film 26 are removed as illustrated in FIG. 11. The spacer 51 and the sacrificial film 26 are removed by wet etching using, for example, a choline aqueous solution (TMY) as an etching solution. As a result, a part of the side surface of the memory film 40 is exposed from the removal part of the sacrificial film 26.

Figure 12:
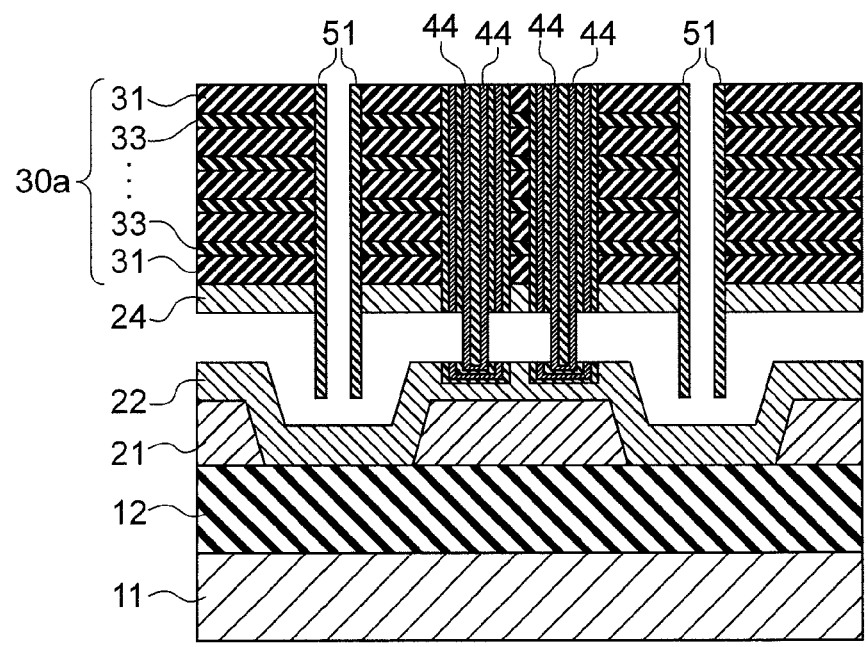
FIG. 12 is a cross-sectional view illustrating etching of the memory film.

Next, a part of each of the charge block layer 41, the charge storage layer 42, and the tunnel insulating layer 43 of the memory film 40 is removed by wet etching using, for example, a hydrofluoric acid solution (DHF). As a result, as illustrated in FIG. 12, the channel layer 44 is exposed from the removal part of the sacrificial film 26 as illustrated in FIG. 12. In this event, the insulating film 25 and the insulating film 27 are also removed.

Figure 13:
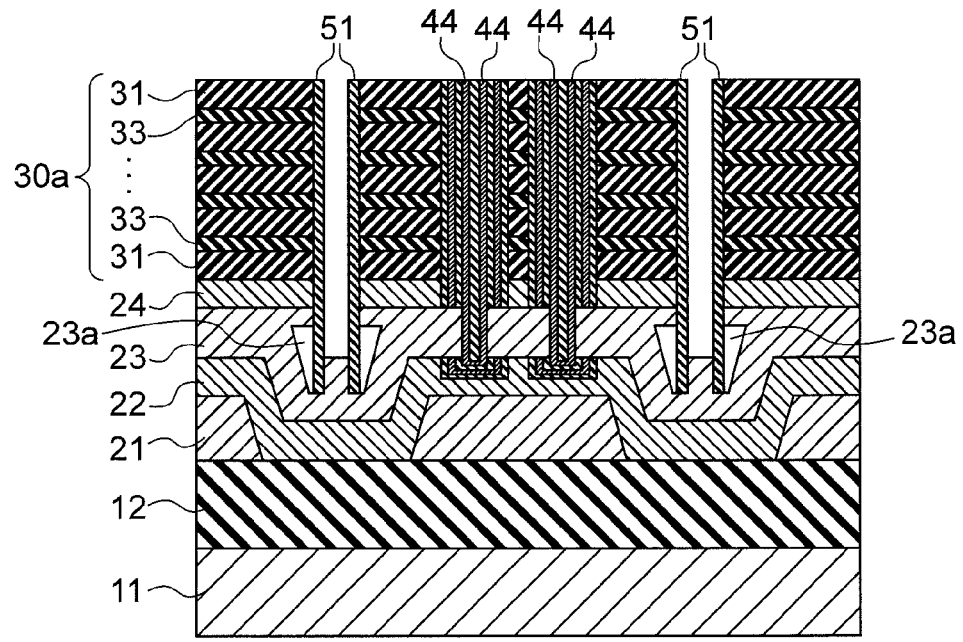
FIG. 13 is a cross-sectional view illustrating the formation of a conductive layer.

Next, as illustrated in FIG. 13, the conductive layer 23 is formed by epitaxial growth of silicon contained in the conductive layer 22 and the conductive layer 24. In this event, the conductive layer 23 comes into contact with the channel layer 44, so that the conductive layer 21 being the source line is electrically connected to the channel layer 44. Further, at this process, the conductive layer 23 grows isotropically along the projecting and recessed shape of the conductive layer 22, so that a void 23a remains in the conductive layer 23. Note that the conductive layer 23 may be formed by CVD (Chemical Vapor Deposition). In this case, the coverage characteristics of the conductive layer 23 improve.

Figure 14:
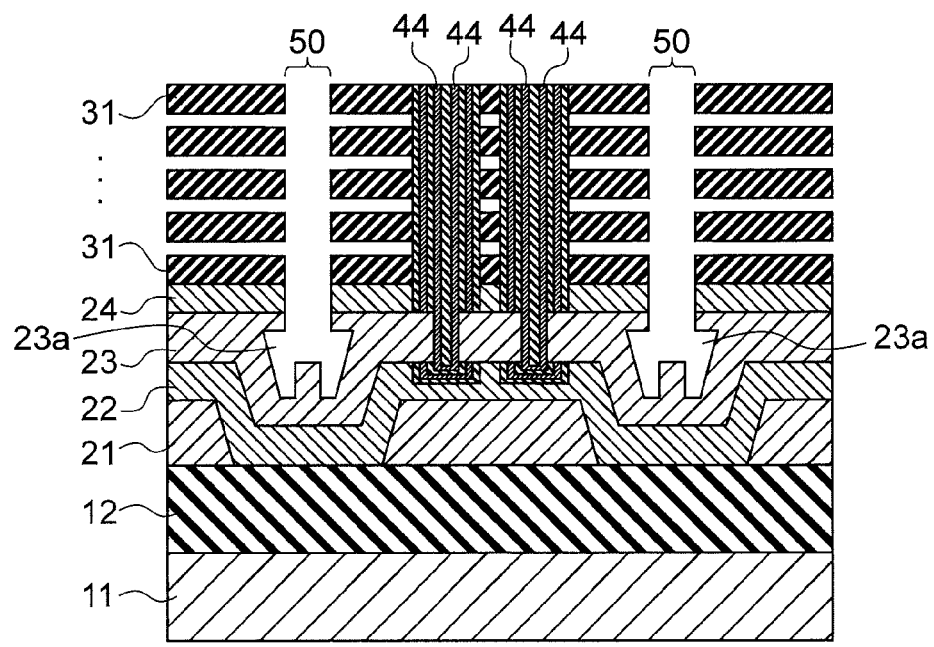
FIG. 14 is a cross-sectional view illustrating etching of the insulating film of the stacked body and the spacer.

After the formation of the conductive layer 23, as illustrated in FIG. 14, the spacer 51 and the insulating film 33 of the stacked body 30a are removed, for example, with a phosphoric acid at high temperature. As a result, the slit 50 becomes wider in the conductive layer 23 than a portion thereof penetrating the stacked body 30a due to communication with the above-explained void 23a.

Thereafter, returning to FIG. 2, the electrode film 32 is replaced with the insulating film 33. Further, an insulating material is embedded in the slit 50. Note that a conductive material may be embedded in the slit 50. In this case, the above-explained wide part of the slit 50 can reduce the electrical resistance between the conductive material and the conductive layer 23.

According to this embodiment explained above, a projecting and recessed pattern is formed in the conductive layer 21 to enable the thick film portion 26*a* and the thin film portion 26*b* to be formed in the sacrificial film 26. Further, the slit 50 is formed at the thick film portion 26*a* and the hole 60 is formed at the thin film portion 26*b* to enable absorption of the processing variation of the slit 50 and the hole 60. As a result, it becomes possible to improve the reliability of the semiconductor memory device 1.

(Second Embodiment)

Figure 15:
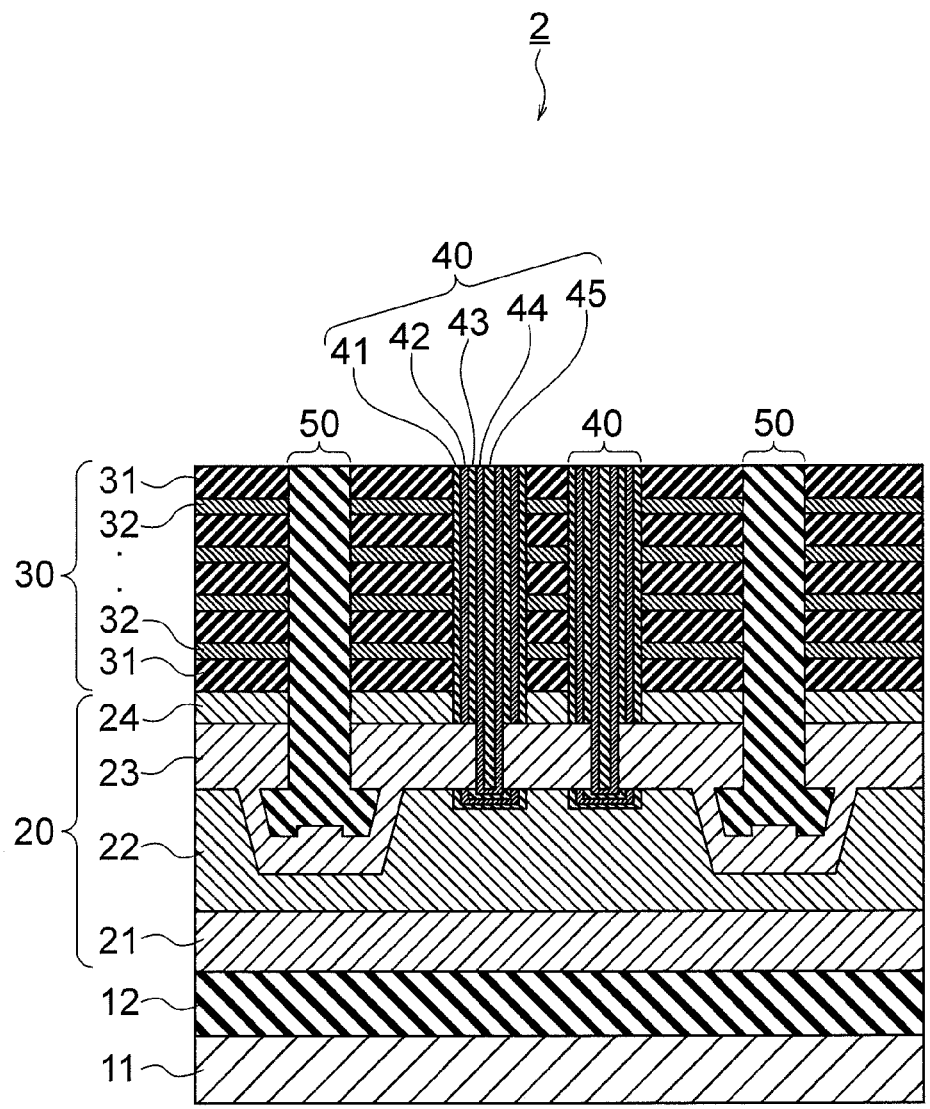
FIG. 15 is a cross-sectional view of a semiconductor memory device according to a second embodiment.

FIG. 15 is a cross-sectional view of a semiconductor memory device according to a second embodiment. The same numerals are given to the same components as those in the above-explained first embodiment to omit detailed explanation thereof.

In a semiconductor memory device 2 according to this embodiment, a thick film portion 26*a* and a thin film portion 26*b* are formed in a conductive layer 23 (sacrificial film 26) by forming a projecting and recessed shape on a conductive layer 22. Hereinafter, a manufacturing method of the semiconductor memory device 2 according to this embodiment will be explained below with reference to FIG. 16 to FIG. 19.

Figure 16:
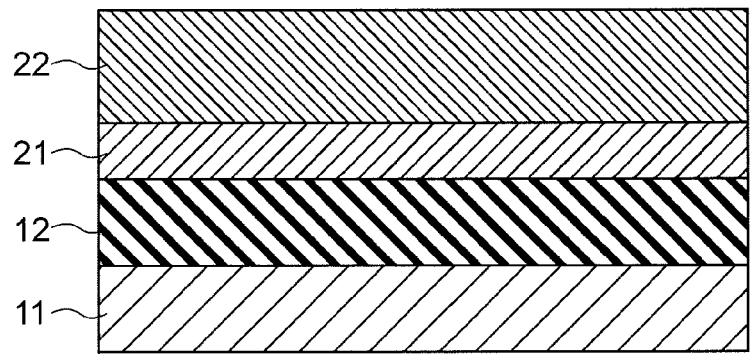
FIG. 16 is a cross-sectional view illustrating the formation of a conductive layer and an insulating film.
Figure 17:
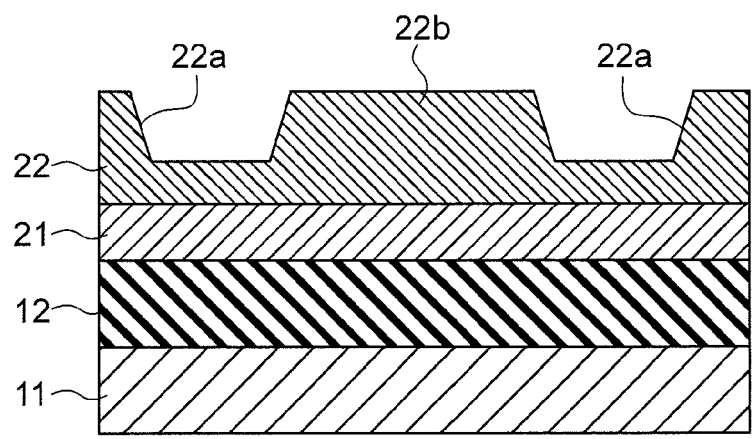
FIG. 17 is a cross-sectional view illustrating the formation of a groove part and a band-shaped part.

First of all, as illustrated in FIG. 16, an insulating film 12, a conductive layer 21, and a conductive layer 22 are formed in sequence on a semiconductor substrate 11. Subsequently, as illustrated in FIG. 17, a groove part 22*a* and a band-shaped part 22*b* are formed on the conductive layer 22.

In this embodiment, a mask pattern in a line shape is formed on the conductive layer 22 using the lithography technology as in the first embodiment. By removing the conductive layer 22 by RIE (Reactive Ion Etching) using the mask pattern, a groove is formed in the conductive layer 21. In this event, this groove does not need to penetrate the conductive layer 22.

Figure 18:
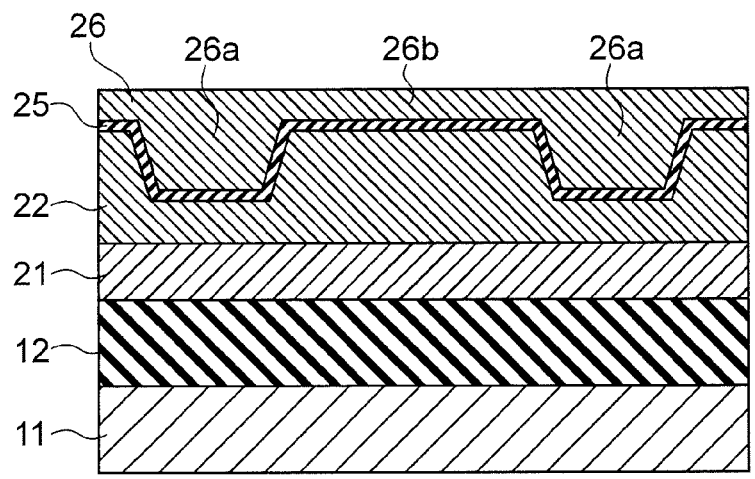
FIG. 18 is a cross-sectional view illustrating the formation of a sacrificial film.

Next, as illustrated in FIG. 18, an insulating film 25 is formed along the projecting and recessed shape of the conductive layer 22, and a sacrificial film 26 is subsequently formed on the insulating film 25. In this embodiment, the sacrificial film 26 is formed thicker than a depth of the groove part 22*a* and is planarized by CMP. As a result, the sacrificial film 26 has a thick film portion 26*a* and a thin film portion 26*b* as in the first embodiment.

Figure 19:
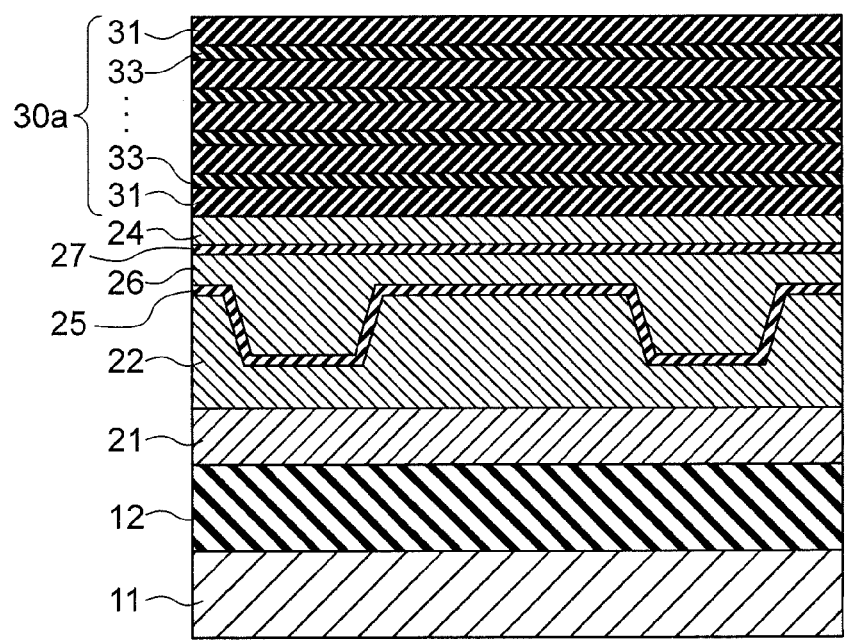
FIG. 19 is a cross-sectional view illustrating the formation of a stacked body.

Next, as illustrated in FIG. 19, an insulating film 27 is formed on the sacrificial film 26, and a conductive layer 24 is subsequently formed on the insulating film 27. Further, a stacked body 30*a* is formed on the conductive layer 24. Thereafter, processes of forming a hole 60, a memory film 40, a slit 50 and so on are performed as in the first embodiment.

Also in this embodiment explained above, the thick film portion 26*a* and the thin film portion 26*b* are formed in the sacrificial film 26 as in the first embodiment. Therefore, the formation of the slit 50 at the thick film portion 26*a* and the formation of the hole 60 at the thin film portion 26*b* enable absorption of the processing variation of the slit 50 and the hole 60, thereby making it possible to improve the reliability of the semiconductor memory device 2.

Further, in this embodiment, the projecting and recessed shape is not formed in the conductive layer 21 being the source line. Therefore, it becomes possible to suppress an increase in electrical resistance of the source line.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A semiconductor memory comprising:
   a semiconductor substrate;
   an insulating film provided on the semiconductor substrate;
   a conductive layer group comprising at least two conductive layers;
   a stacked body provided on the conductive layer group and including a plurality of films stacked;
   a memory film provided in a hole, the hole penetrating the stacked body and a part of the conductive layer group: and
   a slit splitting the stacked body and terminating at a position deeper than a contact portion between the conductive layer group and the memory film,
   wherein the conductive layer group has a band-shaped part projecting to the stacked body side at a portion of the hole, and a groove part recessed to the semiconductor substrate side at a portion under the slit, and
   wherein
   the conductive layer group includes a first conductive layer provided on the insulating film, a second conductive layer provided on the first conductive layer, and a third conductive layer provided on the second conductive layer; and
   the first conductive layer and the second conductive layer has the groove part and the band-shaped part, and the slit terminates in the third conductive layer.

2. A semiconductor memory device comprising:
   a semiconductor substrate;
   an insulating film provided on the semiconductor substrate;
   a conductive layer group comprising at least two conductive layers;
   a stacked body provided on the conductive layer group and including a plurality of films stacked;
   a memory film provided in a hole, the hole penetrating the stacked body and a part of the conductive layer group; and
   a slit splitting the stacked body and terminating at a position deeper than a contact portion between the conductive layer group and the memory film,
   wherein the conductive layer group has a band-shaped part projecting to the stacked body side at a portion of the hole, and a groove part recessed to the semiconductor substrate side at a portion under the slit, and
   wherein:
   the conductive layer group includes a first conductive layer provided on the insulating film, a second conductive layer provided on the first conductive layer, and a third conductive layer provided on the second conductive layer; and
   the second conductive layer has the groove part and the band-shaped part, and the slit terminates in the third conductive layer.

3. The semiconductor memory device according to claim 1, wherein
the slit is wider in the third conductive layer than a portion thereof penetrating the stacked body.

4. A manufacturing method of a semiconductor memory device, the method comprising:
forming a conductive layer group on a semiconductor substrate, the conductive layer group including at least two conductive layers having a groove part and a band-shaped part;
forming a sacrificial film on the conductive layers, the sacrificial film having a thick film portion on the groove part and a thin film portion on the band-shaped part;
forming a stacked body including a plurality of films stacked, on the sacrificial film;
forming a hole penetrating the stacked body and the thin film portion;
forming a memory film in the hole; and
forming a slit, the slit splitting the stacked body and terminating at the thick film portion.

5. The manufacturing method of the semiconductor memory device according to claim 4, further comprising:
forming an insulating film on the semiconductor substrate;
forming a first conductive layer on the insulating film;
forming the groove part and the band-shaped part in the first conductive layer;
forming, on the first conductive layer, a second conductive layer along a projecting and recessed shape of the first conductive layer; and
forming the sacrificial film on the second conductive layer.

6. The manufacturing method of the semiconductor memory device according to claim 4, further comprising:
forming an insulating film on the semiconductor substrate;
forming a first conductive layer on the insulating film;
forming a second conductive layer on the first conductive layer;
forming the groove part and the band-shaped part in the second conductive layer; and
forming the sacrificial film on the second conductive layer.

7. The manufacturing method of the semiconductor memory device according to claim 5, further comprising:
removing the sacrificial film using the slit, and then removing a part of the memory film; and
forming a third conductive layer at a removal part of the sacrificial film, the third conductive layer being in contact with the part of the memory film.

8. The manufacturing method of the semiconductor memory device according to claim 7, wherein
the third conductive layer is formed by epitaxial growth of silicon contained in the second conductive layer and a fourth conductive layer formed on the sacrificial film.

9. The manufacturing method of the semiconductor memory device according to claim 7, wherein
the third conductive layer is formed by CVD (Chemical Vapor Deposition).

10. The manufacturing method of the semiconductor memory device according to claim 4, wherein
a material of the sacrificial film is non-doped polysilicon.

* * * * *